United States Patent
Long et al.

(10) Patent No.: US 9,568,820 B2
(45) Date of Patent: Feb. 14, 2017

(54) METHOD FOR MANUFACTURING COLOR FILTER, COLOR FILTER, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Qingde Long, Beijing (CN); Jiawei Ren, Beijing (CN); Danhui Li, Beijing (CN); Bin Gao, Beijing (CN); Degang Zhao, Beijing (CN); Zhiyong Zhang, Beijing (CN); Yi Chen, Beijing (CN); Changyu Fu, Beijing (CN); Xuejie Bai, Beijing (CN)

(73) Assignees: BOE TECHNOLOGY GROUP CO., LTD., Beijing (CN); CHENGDU BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/890,832

(22) PCT Filed: May 21, 2015

(86) PCT No.: PCT/CN2015/079472
§ 371 (c)(1),
(2) Date: Nov. 12, 2015

(87) PCT Pub. No.: WO2016/082495
PCT Pub. Date: Jun. 2, 2016

(65) Prior Publication Data
US 2016/0349611 A1 Dec. 1, 2016

(30) Foreign Application Priority Data
Nov. 28, 2014 (CN) .......................... 2014 1 0712552

(51) Int. Cl.
*G02B 5/20* (2006.01)
*G02F 1/1335* (2006.01)
(Continued)

(52) U.S. Cl.
CPC ............. *G03F 7/0007* (2013.01); *G02B 5/201* (2013.01); *G02F 1/133516* (2013.01); *G03F 7/20* (2013.01)

(58) Field of Classification Search
CPC ..... G03F 7/0007; G02F 1/133516; G02B 5/20
(Continued)

(56) References Cited

U.S. PATENT DOCUMENTS

2007/0122721 A1   5/2007   Bae et al.
2012/0100471 A1   4/2012   Lin
(Continued)

FOREIGN PATENT DOCUMENTS

CN   101013221 A   8/2007
CN   101021582 A   8/2007
(Continued)

OTHER PUBLICATIONS

Computer-generated translation of JP 7-294715 (Nov. 1995).*
(Continued)

*Primary Examiner* — John A McPherson
(74) *Attorney, Agent, or Firm* — Ladas & Parry LLP

(57) ABSTRACT

A method for manufacturing color filter, a color filter, and a display device including the color filter are disclosed. The method for manufacturing a color filter includes: forming a black matrix on a transparent substrate; forming a photosensitive resist layer on the transparent substrate with the black matrix; disposing a reflection sheet capable of reflecting light on a first side of the transparent substrate to be exposed, the first side being provided with the black matrix; disposing a mask on a second side of the transparent
(Continued)

substrate to be exposed, the second side being not provided with the black matrix; and carrying out an exposing process from the second side of the transparent substrate.

20 Claims, 4 Drawing Sheets

(51) Int. Cl.
  *G03F 7/00* (2006.01)
  *G03F 7/20* (2006.01)
(58) Field of Classification Search
  USPC .............................................. 430/7; 349/106
  See application file for complete search history.

(56) References Cited

U.S. PATENT DOCUMENTS

| | | |
|---|---|---|
| 2014/0051814 A1 | 2/2014 | Li et al. |
| 2015/0152210 A1 | 6/2015 | Wang et al. |

FOREIGN PATENT DOCUMENTS

| | | | |
|---|---|---|---|
| CN | 101246285 A | | 8/2008 |
| CN | 102455542 A | | 5/2012 |
| CN | 102707484 A | | 10/2012 |
| CN | 102741746 A | | 10/2012 |
| CN | 102786631 A | | 11/2012 |
| CN | 102879947 A | | 1/2013 |
| CN | 103033981 A | | 4/2013 |
| CN | 103232603 A | | 8/2013 |
| CN | 104020603 A | | 9/2014 |
| CN | 104360428 A | | 2/2015 |
| JP | 01-090905 A | * | 3/1989 |
| JP | 07-294715 A | * | 11/1995 |
| JP | 2010-282051 A | * | 12/2010 |
| JP | 2012-018256 A | | 1/2012 |

OTHER PUBLICATIONS

Computer-generated translation of JP 2010-282051 (Dec. 2010).*
International Search Report & Written Opinion Appln. No. PCT/CN2015/079472; Dated Aug. 5, 2015.
First Chinese Office Action Appln. No. 201410712552.5; Dated Mar. 17, 2016.

* cited by examiner

METHOD FOR MANUFACTURING COLOR FILTER, COLOR FILTER, AND DISPLAY DEVICE

TECHNICAL FIELD

Embodiments of the present invention relate to a method for manufacturing color filter, a color filter, and a display device.

BACKGROUND

Color filter is an important component in liquid crystal displays. In liquid crystal displays, the intensive light emitted from a backlight module represents, after being processed by a color filter, a colorful image. Typically, the structure of a color filter includes a transparent substrate, a black matrix provided on said transparent substrate, a color layers consisting of three primary colors, red, green, and blue, and a transparent conductive layer, etc.

In the prior art, typically, the method for manufacturing a color filter is: firstly, fabricating a black matrix on a transparent substrate, to form an interval; and then, arranging the three primary colors, red, green, and blue, in the color layers for each pixel, subsequently. In the method, back exposing technic was employed in the fabrication of the color layers, to achieve the contraposition of the black matrix and the color layers. However, during the back exposing process, there is a gap between the black matrix and the color layers, due to insufficient exposing between the black matrix and the color layers, resulting in non-uniform edge luminance and color and poor contrast of the liquid crystal display module. With reference to FIGS. 1 and 2, these figures illustrate a prior back exposing process, as well as the schematic diagram of the color layers after being developed by a prior hack exposing process.

SUMMARY

Embodiments of the present invention provides a method for manufacturing color filter, a color filter, and a display device, to solve the problems of non-uniform edge luminance and color and poor contrast of prior liquid crystal display modules.

A method for manufacturing a color filter, comprising: forming a black matrix on a transparent substrate; forming a photosensitive resist layer on the transparent substrate with the black matrix; disposing a reflection sheet capable of reflecting light on a first side of the transparent substrate to be exposed, the first side being provided with the black matrix; disposing a mask on a second side of the transparent substrate to be exposed, the second side being not provided with the black matrix; and carrying out an exposing process from the second side of the transparent substrate.

In some embodiments, a surface of the reflection sheet facing a light source for the exposing process is a plane surface.

In some embodiments, a surface of the reflection sheet facing a light source for the exposing process is a curved surface.

In some embodiments, the curved surface is a V-shaped surface comprising a plurality of V-shaped grooves disposed side by side along a same direction, or an S-shaped surface with an S-shaped section.

In some embodiments, an distance between the reflection sheet and the transparent substrate is from 100 to 500 μm.

In some embodiments, the V-shaped grooves have a same size and height, and an interval between two adjacent V-shaped grooves is less than or equal to a width of a sub-pixel.

In some embodiments, the top angle of each V-shaped groove is in the range of from 168 to 180 degree.

In some embodiments, each S-shape in the S-shaped surface has a same size, and an interval between vertexes of two adjacent S-shapes is less than or equal to a width of a sub-pixel.

In some embodiments, an angle between a tangent at a vertex of an S-shape and a horizontal direction is greater than 0 degree and less than 6 degree.

A color filter, wherein the color filter is manufactured by the above mentioned method for manufacturing the color filter.

A display device, including the above mentioned color filter.

In the method for manufacturing color filter, the color filter, and the display device provided in embodiments according to the present invention, because a reflection sheet capable of reflecting light is disposed above the transparent substrate, the incident light from below the transparent substrate can be reflected by the reflection sheet, thus the light reflected by the reflection sheet irradiates onto the transparent substrate again, which improves the exposing efficiency significantly and enables a complete exposing between the black matrix and the color layers, such that there is no gap between the color layers and the black matrix formed on the transparent substrate. Therefore, if the color filter is applied in a liquid crystal display module, the liquid crystal display module will have uniform edge luminance and color and better contrast.

BRIEF DESCRIPTION OF THE DRAWINGS

Drawings of examples will be described briefly to illustrate the technical solutions of the present invention more clearly. Obviously, each drawing in the following description refers only to some of the examples according to the present invention, and will not limit the present invention.

DETAILED DESCRIPTION

The technical solution of an example of the present invention will be described clearly and completely, with reference to a figure of each example of the present invention, to make the objectives, technical solutions and advantages of an example of the present invention more clear. Obviously, each example described is a part of, not all, examples of the present invention. All other examples which can be obtained by a skilled person in the art on the basis of the described examples according to the present invention without creative work will fall within the protection scope of the present invention.

Figure 1:
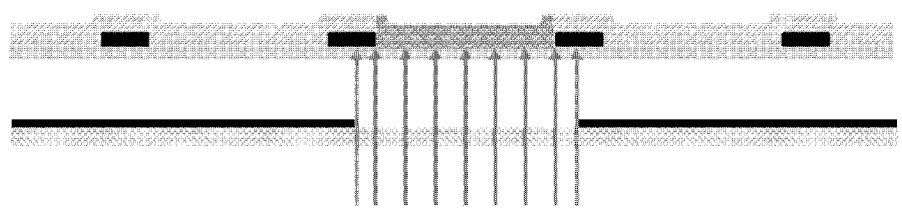
FIG. 1 is a schematic diagram of a prior back exposing process.
Figure 2:
FIG. 2 is a schematic diagram of color layers after being back exposed and developed by a prior back exposing process.
Figure 3:
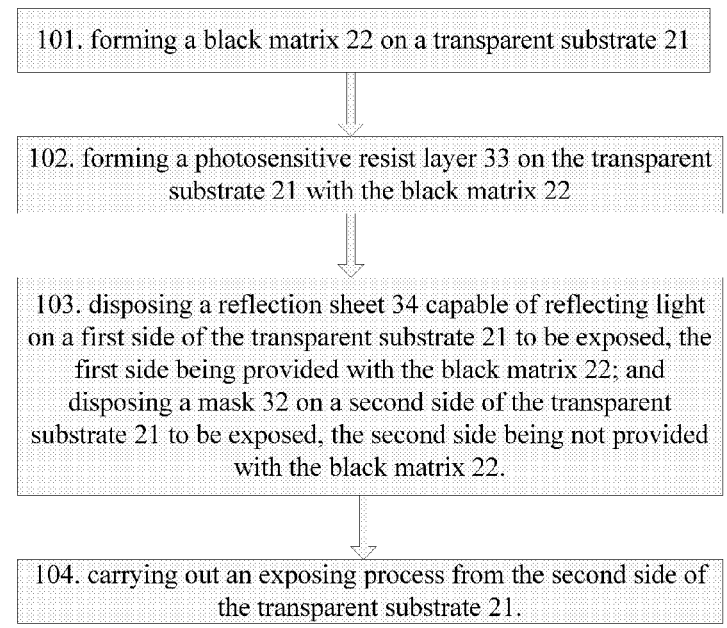
FIG. 3 is a flow chart of a method for manufacturing color filter provided according to an example of the present invention.
Figure 4:
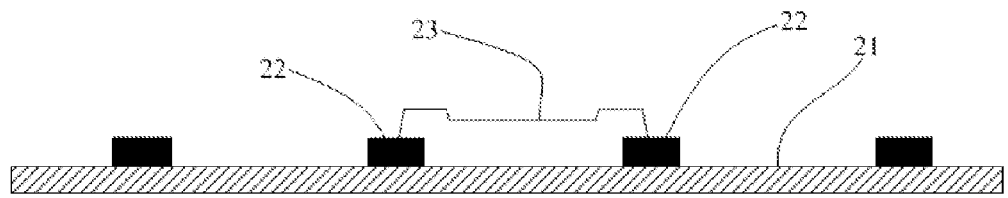
FIG. 4 is a schematic diagram of color layers after being back exposed and developed by a transparent substrate provided according to an example of the present invention.
Figure 5:
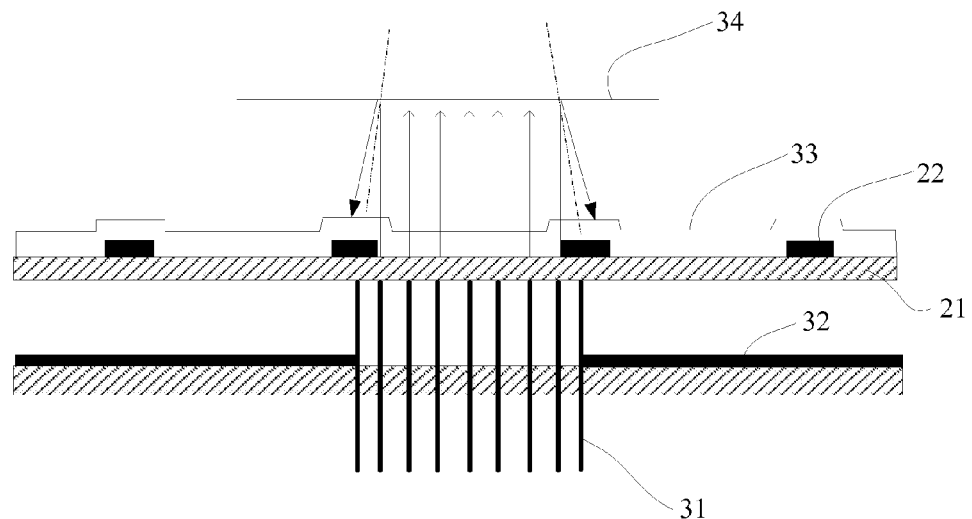
FIG. 5 is a schematic diagram of a kind of exposing process in a method for manufacturing color filter provided according to an example of the present invention.

With reference to FIG. 3, FIG. 4, and FIG. 5, the present invention provides a method for manufacturing color filter, comprising steps 101, 102, 103 and 104.

Step 101. forming a black matrix 22 on a transparent substrate 21.

In some embodiments, the black matrix 22 is formed on the transparent substrate 22 by coating, specifically, with an interval being formed between the black matrix 22.

Step 102. forming a photosensitive resist layer 33 on the transparent substrate 21 with the black matrix 22.

Specifically, taking a color filter with three primary colors, red, green, and blue in its color resistance layers as an example, arranging each color resistance material for three primary colors, red, green, and blue in each pixel sequentially; then pre-baking the transparent substrate 21 coated with the photosensitive resist layer 33, and then carrying out a cooling process to accelerate the cooing of transparent substrate 21.

After cooling of photosensitive resist layer 33, disposing transparent substrate 21 into an exposing machine (not shown in figures), to wait for carrying out exposing process of transparent substrate 21 with the exposing machine;

Step 103. disposing a reflection sheet 34 capable of reflecting light on a first side of the transparent substrate 21 to be exposed, the first side being provided with the black matrix 22; and disposing a mask 32 on a second side of the transparent substrate 21 to be exposed, the second side being not provided with the black matrix 22.

Step 104. carrying out exposing process from the second side of the transparent substrate 21. Specifically, light 31 can irradiate from below the transparent substrate 21. Because the reflection sheet 34 capable of reflecting light is disposed above the transparent substrate 21 and the black matrix 22 is formed under the transparent substrate 21, light 31, which is irradiated from below the transparent substrate 21 and is not blocked by the mask 32, can be reflected to the transparent substrate 21 by the reflection sheet 34, such that the exposing effect of the transparent substrate 21 is improved. Transparent substrate 21 to be exposed can be exposed by a back exposing process. Specifically, it can be irradiated by UV light, and incident light 31 can be adjusted selectively, as required, to form a certain angle against the vertical direction. As used herein, the terms "color resistance layers" and "color layers" have the same meaning, and differ from "color filter" in that, in a whole color filter, an area corresponding to a single pixel/subpixel is referred to a color layer or a color resistance layer.

In a method for manufacturing color filter provided in an example according to the present invention, because a reflection sheet 34 capable of reflecting light is disposed on a first side of the transparent substrate 21, the first side being provided with the black matrix 22, the incident light 31 from a side without the black matrix 22 of the transparent substrate 21 can be reflected by the reflection sheet 34 and thus light 31 reflected by the reflection sheet 34 irradiates onto the transparent substrate 21 again, which improves the exposing efficiency significantly and enables a complete exposing between the black matrix 22 and the color layers 23, such that there is no gap between the color layers 23 and the black matrix 22 formed on transparent substrate 21. Therefore, if the color filter is applied in a liquid crystal display module, the liquid crystal display module will have uniform edge luminance and color and better contrast.

With reference to FIG. 5, in an above mentioned example, a surface of reflection sheet 34 facing the light source for the exposing process can be a plane surface. Since plane-type reflection sheet 34 is suitable for the manufacture of all types of color filters, plane-type reflection sheet 34 can be set as a universal reflection sheet. In order to improve exposing efficiency, incident light 31 can be selected to form a certain angle against vertical direction.

In an above mentioned example, a surface of reflection sheet 34 facing a light source for the exposing process can be a curved surface. The curved surface is uneven, and thus has a better light reflection or light scattering effect, and can improve exposing effect to a certain extent.

Figure 6:
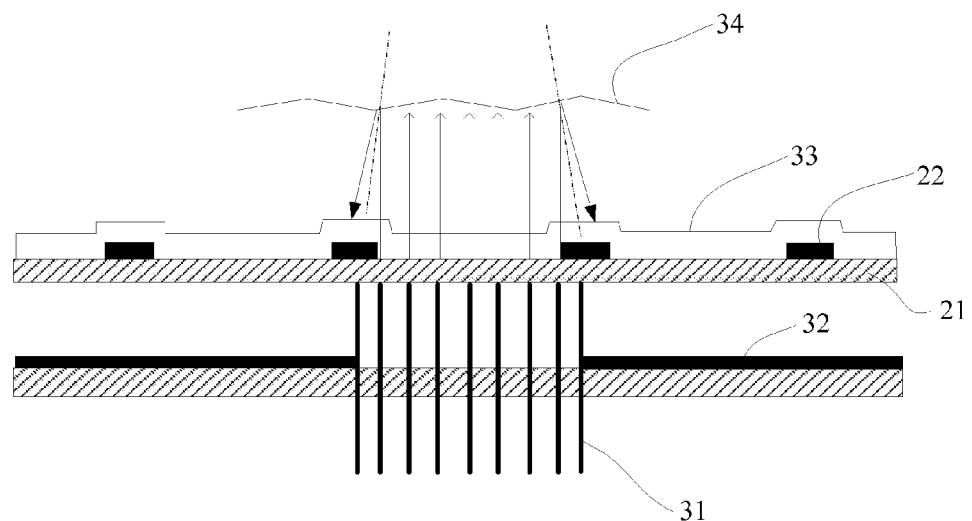
FIG. 6 is a schematic diagram of another kind of exposing process in a method for manufacturing color filter provided according to an example of the present invention.
Figure 7:
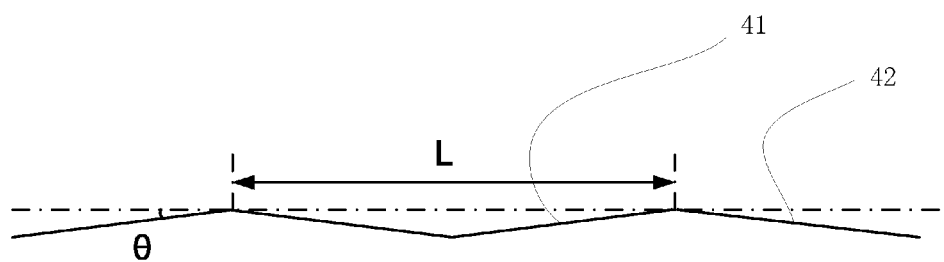
FIG. 7 is a schematic diagram of a cross section of a kind of reflection sheet provided according to an example of the present invention.

With reference to FIG. 6 and FIG. 7, in some embodiments, the curved surface can be a V-shaped surface comprising a plurality of V-shaped grooves 41 disposed side by side along a same direction, or an S-shaped surface with an S-shaped section.

In some embodiments, the V-shaped grooves 41 have a same size and height, and an interval between two adjacent V-shaped grooves 41 is less than or equal to a width of a sub-pixel; the top angle of each V-shaped groove 41 is in the range of from about 168 to about 180 degree.

For the disposing of reflection sheet 34 having a V-shaped surface, the size of a sub-pixel of color layers should be considered. A non-repetitive pixel in a pixel is referred as a sub-pixel. For instance, disposing reflection sheet 34 having a V-shaped surface in a direction parallel to a horizontal plane, and setting an interval between two V-shaped edges 42 of V-shaped groove 41 to be L, such that an angle between an inclined plane of V-shaped groove 41 and a horizontal plane is θ, the length of L can be equal to or less than a width of a sub-pixel, and the width of a sub-pixel is approximate to a width of two adjacent parts of black matrix 22 corresponding source/drain electrodes, preferably, within about ±20% or about ±10% of the width of two adjacent parts of black matrix 22 corresponding source/drain electrodes. Preferably, the width of a sub-pixel is equal to the width of two adjacent parts of black matrix 22 corresponding source/drain electrodes.

In some embodiments, reflection sheet 34 having a V-shaped surface can also be a V-shaped surface with a certain interval between two adjacent V-shaped grooves 41, and the surface within the interval is a plane surface, forming a light-reflecting area with a certain width and parallel to horizontal plane. The width of the area can be equal to the line width of black matrix 22 in the direction of source/drain electrodes, and a trough of each V-shaped groove 41 is located at a central of a sub-pixel, such that a transmitted part of incident light 31, after being absorbed by photosensitive resist 33, is reflected by reflection sheet 34 again, and is capable of irradiating towards the back surface of the part which cannot be transmitted by light 31. This part of light 31 will initiate crosslinking reaction of photosensitive resist 33 located at an edge part of black matrix 22 and a sub-pixel or an overlapping part of black matrix 22 and a sub-pixel.

Figure 8:
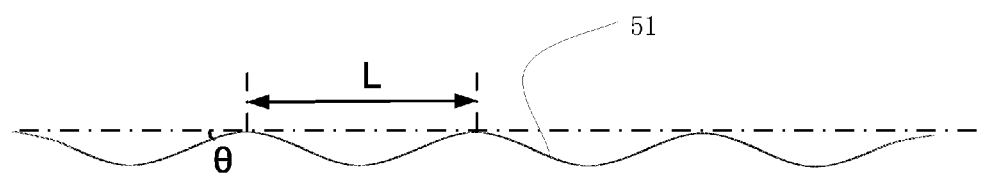
FIG. 8 is a schematic diagram of a cross section of another kind of reflection sheet provided according to an example of the present invention.

In some embodiments, the top angle of each V-shaped groove 41 is in the range of from about 168 to about 180 degree. That is to say, θ is ideally less than or equal to 6 degree, preferably less than or equal to 3 degree. An angle between a tangent at a vertex of S-shape 51 and a horizontal direction is greater than 0 degree and less than about 6 degree. The above mentioned settings can prevent incident light 31 from irradiating onto another pixel, preventing a pixel which is not to be exposed from being exposed With reference to FIG. 8, the above mentioned curved surface can be an S-shaped surface with an S-shape 51.

Wherein, each S-shape 51 of an S-shaped surface has a same size, and an interval between the vertexes of two adjacent S-shapes is less than or equal to the width of a sub-pixel.

The reflection sheet 34 having the S-shaped surface is similar to that of above mentioned V-shaped surface, except that the surface shape of reflection sheet 34 is different. The exposing mechanism of reflection sheet 34 having an S-shaped surface is the same as reflection sheet 34 having a V-shaped surface, and thus is omitted here.

In above examples, the distance between reflection sheet 34 and transparent substrate 21 is about 100-500 μm. Specifically, it is very difficult to set incident light 31 from an exposing machine vertical (that is, at an incident angel of 0 degree) to a surface of transparent substrate 21 (typically, an incident angle of light 31 is less than or equal to about 2-about 2.5 degree, and an incident angle of light 31 being processed by filtering is less than or equal to about 1-about 1.5 degree), and thus each suitable distance between a surface of plane-shaped reflection sheet 34, V-shaped reflection sheet 34, and S-shaped reflection sheet 34 and a surface of transparent substrate 21 can be controlled to be about 100-about 500 μm. In some embodiments, each suitable distance between a surface of plane-shaped reflection sheet 34, V-shaped reflection sheet 34, and S-shaped reflection sheet 34 and a surface of transparent substrate 21 can be controlled to be 100-300 μm, to ensure exposing effect and the accuracy of an exposed area.

In above embodiments, after color layers 23 are formed, a planarization layer can be formed on transparent substrate 21, a transparent conductive layer may also be formed, and a spacer layer may be finally formed. In some embodiments, the forming of a transparent conductive layer can also be carried out in the final step, after finishing cell assembling.

An example of the present invention also provides a color filter, wherein the color filter is manufactured by above method for manufacturing the color filter. Because the reflection sheet 34 capable of reflecting light is disposed on the side provided with black matrix 22 of the transparent substrate 21 in the color filter, such that incident light 31 from a side without black matrix 22 of transparent substrate 21 can be reflected by reflection sheet 34 and thus light 31 reflected by reflection sheet 34 irradiates onto transparent substrate 21 again, which improves the exposing effect significantly and enables a complete exposing between black matrix 22 and color layers 23, such that there is no gap between color layers 23 and black matrix 22 formed on transparent substrate 21. Therefore, if the color filter is applied in a liquid crystal display module, the liquid crystal display module will have uniform edge luminance and color and better contrast.

An example of the present invention also provides a display device, including above color filter. Because a reflection sheet 34 capable of reflecting light is disposed on a side of the transparent substrate 21, the first side being provided with the black matrix 22, the incident light 31 from a side without black matrix 22 of transparent substrate 21 can be reflected by reflection sheet 34 and thus light 31 reflected by reflection sheet 34 irradiates onto transparent substrate 21 again, which improves the exposing efficiency significantly and enables a complete exposing between black matrix 22 and color layers 23, such that there is no gap between color layers 23 and black matrix 22 formed on transparent substrate 21. Therefore, if the color filter is applied in a liquid crystal display module, the liquid crystal display module will have uniform edge luminance and color and better contrast, and accordingly, the display device will have uniform edge luminance and color and better contrast. Said display device can be a product or a component thereof having a display function, such as a liquid crystal panel, an electronic paper, an OLED (organic light-emitting diode panel), a liquid crystal TV, a liquid crystal display, a digital picture frame, a cell phone, a tablet computer, or the like.

The present invention comprises the following embodiments:

Embodiment 1

A method for manufacturing a color filter, comprising: forming a black matrix on a transparent substrate; forming a photosensitive resist layer on the transparent substrate with the black matrix; disposing a reflection sheet capable of reflecting light on a first side of the transparent substrate to be exposed, the first side being provided with the black matrix; disposing a mask on a second side of the transparent substrate to be exposed, the second side being not provided with the black matrix; and carrying out an exposing process from the second side of the transparent substrate.

Embodiment 2

The method for manufacturing the color filter according to embodiment 1, wherein a surface of the reflection sheet facing a light source for the exposing process is a plane surface.

Embodiment 3

The method for manufacturing the color filter according to embodiment 1, wherein a surface of the reflection sheet facing a light source for the exposing process is a curved surface.

Embodiment 4

The method for manufacturing the color filter according to embodiment 3, wherein the curved surface is a V-shaped surface comprising a plurality of V-shaped grooves disposed side by side along a same direction, or an S-shaped surface with an S-shaped section.

Embodiment 5

The method for manufacturing the color filter according to any one of embodiments 1-4, wherein an distance between the reflection sheet and the transparent substrate is about 100 to about 500 μm.

Embodiment 6

The method for manufacturing the color filter according to embodiment 4 or embodiment 5, wherein the V-shaped grooves have a same size and height, and an interval between two adjacent V-shaped grooves is less than or equal to a width of a sub-pixel.

Embodiment 7

The method for manufacturing the color filter according to any one of embodiments 4-6, wherein the top angle of each V-shaped groove is in the range of from about 168 to about 180 degree.

Embodiment 8

The method for manufacturing the color filter according to any one of embodiments 4-7, wherein each S-shape in the S-shaped surface has a same size, and an interval between vertexes of two adjacent S-shapes is less than or equal to a width of a sub-pixel.

Embodiment 9

The method for manufacturing the color filter according to any one of embodiments 4-8, wherein an angle between a tangent at a vertex of a S-shape and a horizontal direction is greater than 0 degree and less than about 6 degree.

Embodiment 10

The method for manufacturing the color filter according to any one of embodiments 1-9, further comprising forming color layers on the first side of the transparent substrate, after the exposing process.

Embodiment 11

The method for manufacturing the color filter according to embodiment 5, wherein an distance between the reflection sheet and the transparent substrate is in the range of from about 100 to about 300 μm.

Embodiment 12

The method for manufacturing the color filter according to embodiment 6, wherein an interval between two adjacent V-shaped grooves is greater than 0, and a surface within the interval is a plane.

Embodiment 13

The method for manufacturing the color filter according to embodiment 6, wherein the interval between two adjacent V-shaped grooves is equal to a line width of the black matrix in the direction of source/drain electrodes.

Embodiment 14

The method for manufacturing the color filter according to any one of embodiments 4-12, wherein a trough of each V-shaped groove is located at a central of a sub-pixel.

Embodiment 15

The method for manufacturing a color filter according to embodiment 6, wherein a top angel of each V-shaped groove is between about 174 degree and about 180 degree.

Embodiment 16

The method for manufacturing the color filter according to any one of embodiments 4-5, wherein a width L of each V-shaped groove is less than or equal to a width of a sub-pixel.

Embodiment 17

The method for manufacturing the color filter according to any one of embodiments 1-10, further comprising one or more of the following steps: forming color layers; forming a planarization layer on the transparent substrate after forming the color layers; forming a transparent conductive layer on the transparent substrate after forming the color layers; and forming a spacer layer.

Embodiment 18

A color filter, wherein the color filter is manufactured by the method for manufacturing the color filter according to any one of embodiments 1-17.

Embodiment 19

A display device, including the color filter according to embodiment 18.

Embodiment 20

The display device according to embodiment 19 is a liquid crystal panel, an electronic paper, an organic light-emitting diode panel, a liquid crystal TV, a liquid crystal display, a digital picture frame, a cell phone, or a tablet computer, or a component thereof, having display function.

The embodiments described above are only illustrative, not restrictive, embodiments of the present invention. The protection scope of the present invention is determined by the accompanying claims.

The present invention claims the priority of Chinese Patent Application No. 201410712552.5, filed on Nov. 28, 2014, whose disclosure is incorporated in entire by reference, as a part of the present invention.

What is claimed is:

1. A method for manufacturing a color filter, comprising:
   forming a black matrix on a transparent substrate;
   forming a photosensitive resist layer on the transparent substrate with the black matrix;
   disposing a reflection sheet, capable of reflecting light, on a first side of the transparent substrate, the first side being provided with the black matrix;
   disposing a mask on a second side of the transparent substrate to be exposed, the second side being not provided with the black matrix; and
   carrying out an exposing process from the second side of the transparent substrate.

2. The method for manufacturing the color filter according to claim 1, wherein a surface of the reflection sheet facing a light source for the exposing process is a plane surface.

3. The method for manufacturing the color filter according to claim 1, wherein a surface of the reflection sheet facing a light source for the exposing process is a curved surface.

4. The method for manufacturing the color filter according to claim 3, wherein the curved surface is a V-shaped surface comprising a plurality of V-shaped grooves disposed side by side along a same direction, or an S-shaped surface with an S-shaped section.

5. The method for manufacturing the color filter according to claim 4, wherein the V-shaped grooves have a same size and height, and an interval between two adjacent V-shaped grooves is less than or equal to a width of a sub-pixel.

6. The method for manufacturing the color filter according to claim 5, wherein an interval between two adjacent V-shaped grooves is greater than 0, and a surface within the interval s a plane.

7. The method for manufacturing the color filter according to claim 5, wherein the interval between two adjacent V-shaped grooves is equal to a line width of the black matrix in the direction of source/drain electrodes.

8. The method for manufacturing a color filter according to claim 5, wherein a top angel of each V-shaped groove is between about 174 degree and about 180 degree.

9. The method for manufacturing the color filter according to claim 4, wherein a top angle of each V-shaped groove is in the range of from about 168 degree to about 180 degree.

10. The method for manufacturing the color filter according to claim 4, wherein each S-shape in the S-shaped surface has a same size, and an interval between vertexes of two adjacent S-shapes is less than or equal to a width of a sub-pixel.

11. The method for manufacturing the color filter according to claim 4, wherein an angle between a tangent at a vertex of a S-shape and a horizontal direction is greater than 0 degree and less than about 6 degree.

12. The method for manufacturing the color filter according to claim 4, wherein a trough of each V-shaped groove is located at a central of a sub-pixel.

13. The method for manufacturing the color filter according to claim 4, wherein a width L of each V-shaped groove is less than or equal to a width of a sub-pixel.

14. The method for manufacturing the color filter according to claim 1, wherein an distance between the reflection sheet and the transparent substrate is about 100 to about 500 µm.

15. The method for manufacturing the color filter according to claim 14, wherein an distance between the reflection sheet and the transparent substrate is in the range of from about 100 µm to about 300 µm.

16. The method for manufacturing the color filter according to claim 1, further comprising forming color layers on the first side of the transparent substrate, after the exposing process.

17. The method for manufacturing the color filter according to claim 1, further comprising one or more of following steps:
   forming color layers;
   forming a planarization layer on the transparent substrate after forming the color layers;
   forming a transparent conductive layer on the transparent substrate after forming the color layers; and
   forming a spacer layer.

18. A color filter, wherein the color filter is manufactured by the method for manufacturing the color filter according to claim 1.

19. A display device, comprising the color filter according to claim 18.

20. The display device according to claim 19, wherein the display device is a liquid crystal panel, an electronic paper, an organic light-emitting diode panel, a liquid crystal TV, a liquid crystal display, a digital picture frame, a cell phone, or a tablet computer, or a component thereof, having a display function.

* * * * *